United States Patent
Bains

(10) Patent No.: US 9,953,693 B2
(45) Date of Patent: *Apr. 24, 2018

(54) FAST EXIT FROM DRAM SELF-REFRESH

(71) Applicant: INTEL CORPORATION, Santa Clara, CA (US)

(72) Inventor: Kuljit S Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/068,925

(22) Filed: Mar. 14, 2016

(65) Prior Publication Data

US 2016/0196866 A1 Jul. 7, 2016

Related U.S. Application Data

(63) Continuation of application No. 12/890,067, filed on Sep. 24, 2010, now Pat. No. 9,292,426.

(51) Int. Cl.
- *G06F 12/00* (2006.01)
- *G06F 12/02* (2006.01)
- *G11C 11/406* (2006.01)
- *G06F 13/16* (2006.01)

(52) U.S. Cl.
CPC ........ *G11C 11/40615* (2013.01); *G06F 12/02* (2013.01); *G06F 13/1636* (2013.01); *G11C 2211/4067* (2013.01)

(58) Field of Classification Search
None
See application file for complete search history.

(56) References Cited

U.S. PATENT DOCUMENTS

| | | | | |
|---|---|---|---|---|
| 5,784,291 A | * | 7/1998 | Chen | G06F 15/78 712/32 |
| 5,901,101 A | * | 5/1999 | Suzuki | G11C 11/406 365/222 |
| 6,317,852 B1 | | 11/2001 | Lau et al. | |
| 6,507,532 B1 | * | 1/2003 | Fujino | G11C 8/12 365/230.03 |
| 6,778,458 B2 | * | 8/2004 | Tsern | G11C 8/08 365/222 |

(Continued)

FOREIGN PATENT DOCUMENTS

| | | |
|---|---|---|
| WO | 2012/040685 A2 | 3/2012 |
| WO | 2012/040685 A3 | 6/2012 |

OTHER PUBLICATIONS

English Translation of the Notice of Preliminary Rejection, Application No. 2013-7007368, dated May 22, 2014, 4 pages.

(Continued)

*Primary Examiner* — Yaima Rigol
(74) *Attorney, Agent, or Firm* — Compass IP Law PC

(57) ABSTRACT

Embodiments of the invention describe a dynamic random access memory (DRAM) device that may abort a self-refresh mode to improve the exit time from a DRAM low power state of self-refresh. During execution of a self-refresh mode, the DRAM device may receive a signal (e.g., a device enable signal) from a memory controller operatively coupled to the DRAM device. The DRAM device may abort the self-refresh mode in response to receiving the signal from the memory controller.

18 Claims, 4 Drawing Sheets

(56) References Cited

U.S. PATENT DOCUMENTS

| | | | | |
|---|---|---|---|---|
| 6,961,278 B2* | 11/2005 | Jeong | G11C 7/1072 | 365/222 |
| 7,085,946 B2 | 8/2006 | Yokoyama et al. | | |
| 7,136,978 B2* | 11/2006 | Miura | G06F 11/1068 | 365/230.03 |
| 7,353,329 B2* | 4/2008 | Ellis | G06F 13/1636 | 365/222 |
| 7,603,512 B2* | 10/2009 | Seo | G06F 13/1626 | 711/106 |
| 7,613,064 B1* | 11/2009 | Wagner | G11C 11/406 | 365/222 |
| 7,869,297 B2* | 1/2011 | Kim | G11C 11/406 | 365/222 |
| 8,122,188 B2* | 2/2012 | Sohn | G06F 13/1636 | 365/222 |
| 8,392,650 B2* | 3/2013 | Bains | G11C 7/22 | 711/106 |
| 2003/0198115 A1* | 10/2003 | Schaefer | G11C 11/406 | 365/222 |
| 2005/0105357 A1* | 5/2005 | Oh | G11C 11/406 | 365/222 |
| 2005/0195674 A1* | 9/2005 | Jang | G11C 11/40615 | 365/222 |
| 2005/0235100 A1* | 10/2005 | Sakurai | G06F 13/1636 | 711/106 |
| 2005/0265103 A1* | 12/2005 | Remaklus, Jr. | G11C 11/40611 | 365/222 |
| 2006/0143372 A1* | 6/2006 | Walker | G06F 13/1636 | 711/106 |
| 2006/0221745 A1* | 10/2006 | Lee | G11C 11/406 | 365/222 |
| 2007/0033338 A1* | 2/2007 | Tsern | G11C 11/406 | 711/106 |
| 2007/0228959 A1* | 10/2007 | Kang | H01J 11/12 | 313/582 |
| 2007/0253270 A1* | 11/2007 | Do | G11C 11/406 | 365/222 |
| 2008/0228959 A1 | 9/2008 | Wang | | |
| 2009/0249169 A1* | 10/2009 | Bains | G06F 11/106 | 714/766 |
| 2009/0303824 A1* | 12/2009 | Oh | G11C 7/04 | 365/222 |
| 2009/0327660 A1* | 12/2009 | Bains | G06F 13/161 | 712/214 |
| 2012/0079182 A1 | 3/2012 | Bains | | |
| 2012/0331220 A1* | 12/2012 | Bains | G11C 11/40615 | 711/106 |

OTHER PUBLICATIONS

Extended European Search Report received for European Patent Application No. 11827701.1, dated Jul. 1, 2014, 6 Pages.

Office Action received for Korean Patent Application No. 2013-7007368, dated May 22, 2014, 3 Pages of English Translation only.

International Preliminary Report on Patentability and Written Opinion received for PCT Patent Application No. PCT/US2011/053179, dated Apr. 4, 2013, 5 pages.

International Search Report and Written Opinion for PCT Patent Application No. PCT/US2011/053179, dated May 3, 2012, 8 pages.

Ed Patnaude, Application Note: Introduction to Synchronous DRAM, Maxwell Technologies, Apr. 25, 2003, http://www.maxwell.com/products/microelectronics/docs/intro_to_sdram.pdf.

Han et al., "Hybrid duty-cycle corrector circuit with dual feedback loop", Electronics Letters, vol. 47, Issue 24, Nov. 24, 2011, 2 Pages.

* cited by examiner

FAST EXIT FROM DRAM SELF-REFRESH

The present application is a continuation of, and claims the benefit of priority of, U.S. patent application Ser. No. 12/890,067, filed Sep. 24, 2010.

FIELD

Embodiments of the invention generally pertain to electronic devices, and more particularly to systems, apparatuses and methods to improve the exit time from a dynamic random access memory (DRAM) low power state of self-refresh.

BACKGROUND

Memory cells in a DRAM device include a transistor and a capacitor to store a bit of data. The memory cells are 'dynamic' because their data decays and becomes invalid due to various leakage current paths to surrounding cells and to the substrate of the device. To keep the data in the cells valid, each memory cell is periodically refreshed.

Every row of cells in a DRAM memory array needs to be refreshed before the data in the row decays to an invalid state. There are two types of refreshes: external refreshes and internal refreshes (i.e., the DRAM device places itself in self-refresh mode).

During internal DRAM memory refreshes, the memory controller has no visibility to when this refresh is initiated. As a result, the controller is designed to wait for an entire refresh cycle (tRFC, plus a guard band, e.g., 10 ns) before issuing a command to the DRAM. The time period a memory controller must wait before issuing a valid command is herein referred to as tXS (i.e., tRFC+10 ns). tRFC for a 2 Gbit device is in the range of 160 ns. The tRFC approximately doubles as DRAM devices increase in density (e.g., tRFC for a 4 GBit device is in the range of 300 ns, tRFC for an 8 Gbit device is in the range of 550 ns), thus increasing tXS.

Therefore it is desirable to reduce the value of tXS for DRAM devices in order to reduce the time a memory controller must wait before issuing valid commands.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as a discussion of other potential embodiments or implementations of the inventive concepts presented herein. An overview of embodiments of the invention is provided below, followed by a more detailed description with reference to the drawings.

DESCRIPTION

Embodiments of the invention describe a DRAM device that may abort a self-refresh mode to improve the exit time from a DRAM low power state of self-refresh. A self-refresh mode is to be understood as a mode to refresh rows of a DRAM device. This mode is managed internally by the DRAM—the DRAM controller has no visibility to when the refresh mode is initiated.

In the prior art, the DRAM controller is designed to wait for a refresh cycle (tRFC) to complete (tRFC plus and a guard band value, e.g. 10 ns) before issuing a command to the DRAM. By enabling a DRAM device to abort a self-refresh mode, the DRAM controller has a significantly shorter wait period before it may issue a command to the DRAM. In one embodiment, a DRAM device is enabled by the memory controller to abort self-refresh modes in order to maintain the option of the DRAM device functioning according to the prior art (i.e., execute a full self-refresh cycle).

Figure 1:
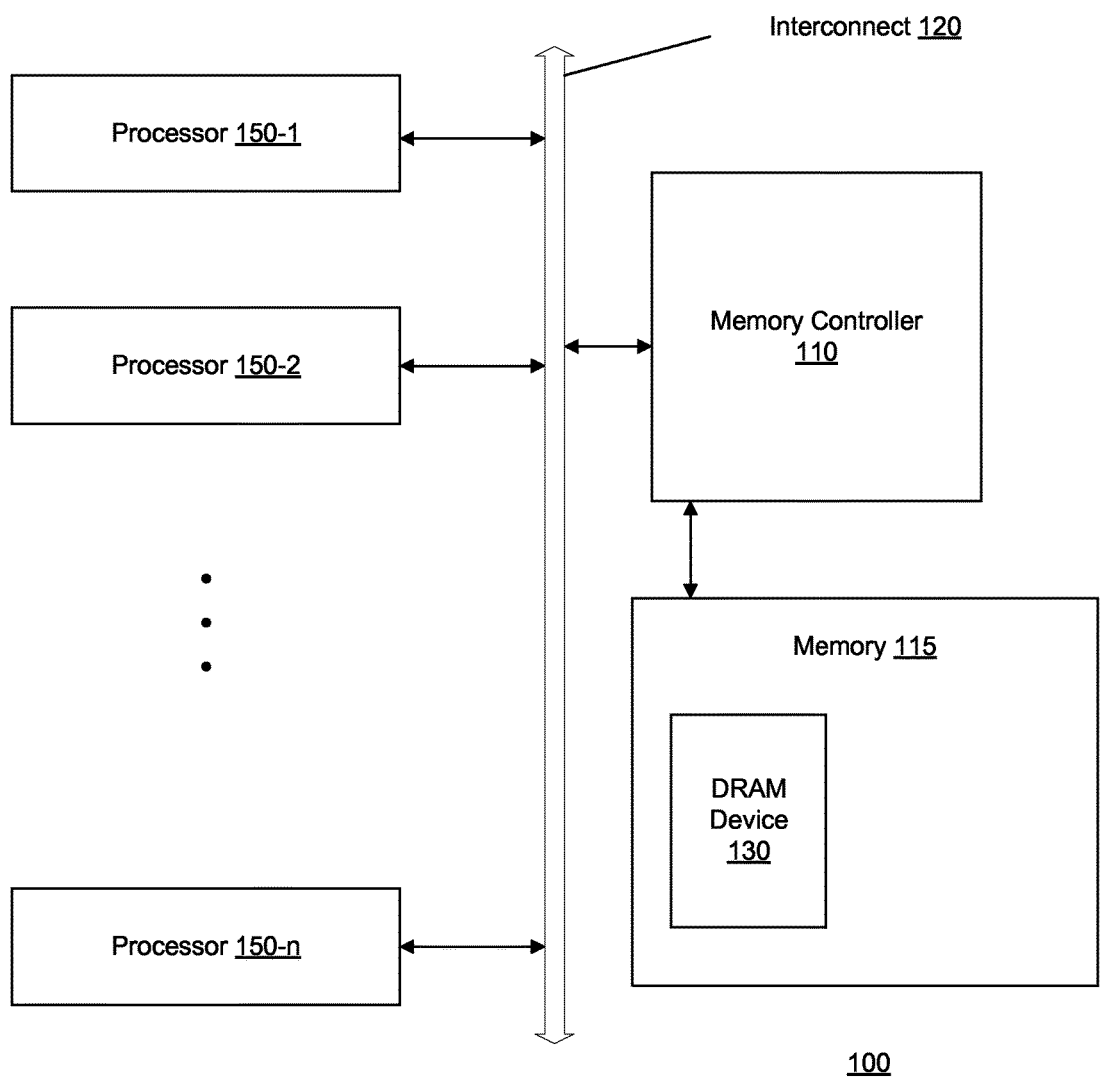
FIG. 1 is a block diagram of selected components of a computing system utilizing an embodiment of the invention.

FIG. 1 is a block diagram of selected components of a computing system utilizing an embodiment of the invention. Computing system 100 includes a plurality of processors (e.g., central processing units and/or cores) 150-1 through 150-n, memory controller 110, memory 115 including (at least one) DRAM memory device 130, and interconnect 120. Memory controller 110 controls, at least in part, the transfer of information between system components and memory 115, and thus the transfer of information between system components and DRAM memory 130. Said system components may include processors 150-1 through 150-n, an input/output device (e.g., a peripheral component interconnect (PCI) Express device), memory itself, or any other system component that requests access to memory 115. In other embodiments, memory controller 110 may be included (or integrated) with a system processor.

Both memory controller 110 and DRAM device 130 may cause a refresh of the DRAM memory cells to occur. Memory controller 110 may issue a command to DRAM device 130 to refresh some or all of its memory cells. DRAM device 130 may also execute a "self-refresh" mode—essentially a plurality of commands to refresh the cells of the device (e.g., each command may execute a refresh of a plurality of rows).

In this embodiment, memory controller 110 is responsible for "enabling" DRAM 130 (e.g., asserting a "clock enable" signal). DRAM 130 may abort an executing self-refresh mode in response to receiving the enable signal from memory controller 110 (or a dedicated signal from memory controller 110 initialing the exit from self-refresh mode). It is to be understood that aborting an executing self-refresh mode allows for a significant reduction in the time memory controller 110 must wait before issuing a valid command (i.e., tXS). Thus, aborting a self-refresh mode is also referred to herein as a fast exit from DRAM self refresh. Operations describing how DRAM 130 may abort said self-refresh mode are described below.

DRAM device 130 may require memory controller 110 to "enable" the device to abort self-refresh modes (i.e., enable "fast exit" mode for the device). If the "fast exit" mode is not enabled, then DRAM device 130 will not abort the self-refresh mode. Memory controller 110 will be aware if "fast exit" mode is or is not enabled, and adjust the timing of issuing commands to the DRAM device accordingly.

Figure 2:
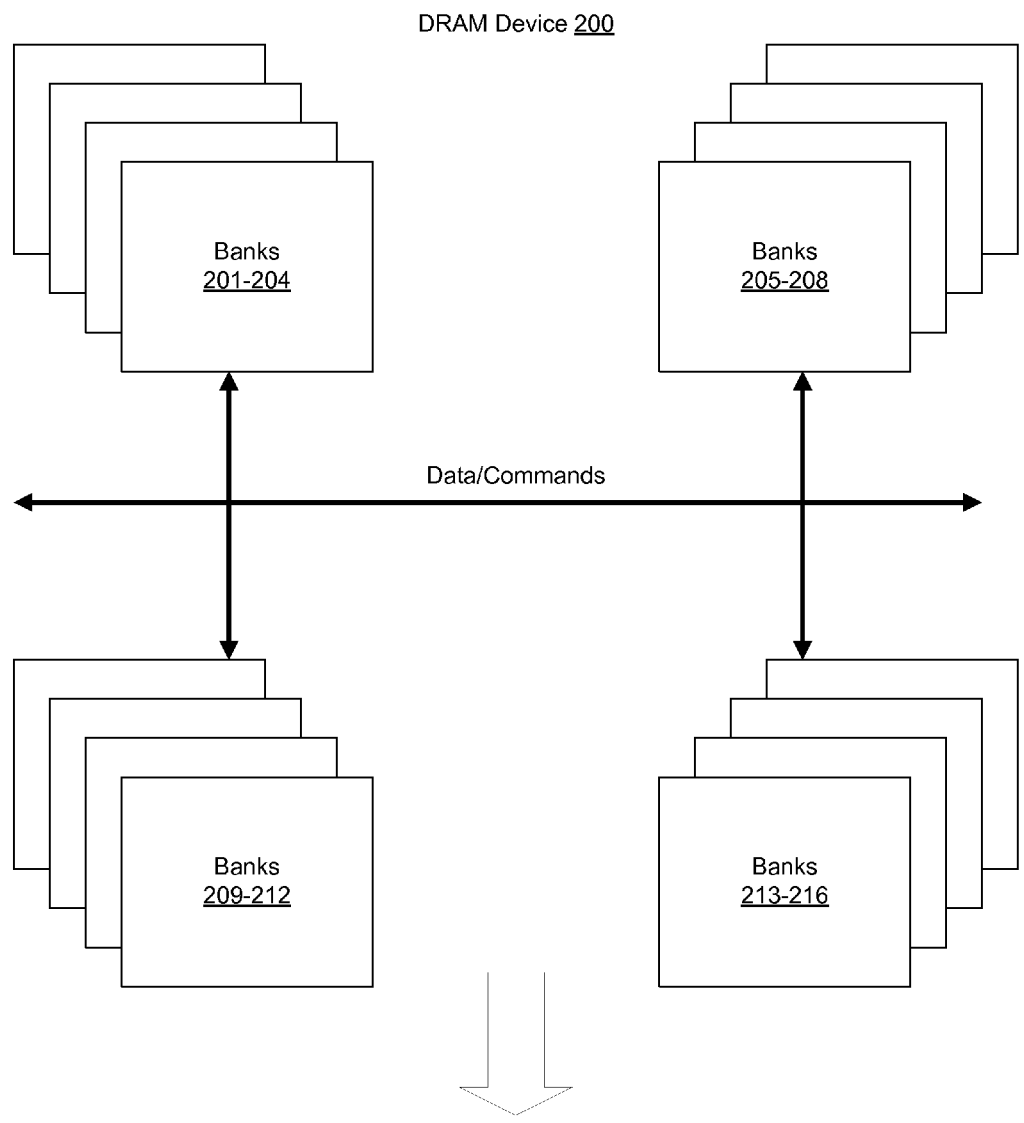
FIG. 2 is a block diagram of components of a DRAM device utilizing an embodiment of the invention.

FIG. 2 is a block diagram of components of a DRAM device utilizing an embodiment of the invention. In this example, a DRAM memory includes (at least one) double-data rate (DDR) 4×4 device 200. DRAM device 200 may include plurality of memory banks 201-216 (other embodiments may be utilized by devices including more or less banks). Memory banks 201-216 may have differing types of memory cells in some embodiments (e.g., one type of memory cell may be faster than others or may consume more or less power compared with other memory cell types). Moreover, various types of DRAM may be utilized for the memory banks shown in FIG. 2, including for example, Graphics DRAM, Fast DRAM, Low Power DRAM, etc.

Banks 201-216 may be organized within four bank groups, each group including four banks (i.e., group 201-204, 205-208, 209-212 and 213-216). In this example, 32 bits of data are transferred for every read or write access.

According to the DDR3 specification (as defined by JEDEC JESD79-3) the refresh period is 64 ms and refresh interval is 7.8 us. This translates to 8K refresh commands during the refresh period (64 ms/7.8 us=8K). In this example, DRAM device 200 has 32K rows per bank; thus each refresh command will refresh four rows of memory (32K/8K=4).

A self-refresh mode executed by DRAM device 200 may be aborted during the execution of a refresh command (i.e., during the refresh of four rows of memory in this embodiment). It is to be understood that when DRAM device 200 receives an indication to abort a self-refresh mode (e.g., a device enable signal from the DRAM controller, a dedicated signal from the controller to abort the self-refresh, etc.), it may increase the efficiency of subsequent self-refresh mode executions to keep track of which rows were able to be refreshed, and which rows have yet to be refreshed. Row refreshes may be kept track of through row address counter 250 containing bits B14-B0—because there are 32k rows per bank, DRAM device 200 would require 15 row address bits for row address counter 250.

Because four rows of memory are refreshed per refresh command in this embodiment, two bits (e.g., B0 and B1) may indicate the specific row to refresh, and the remaining bits indicate which bank group and bank includes the row to be refreshed. In this example, at the start of each refresh command, bits B1 and B0 are 00. If a refresh command is issued then the remaining row address bit segment (e.g., B14-B2) is incremented by one and bits B1 and B0 cycle thru 00, 01, 10 and 11. This assumes that four rows of memory are refreshed in all the banks.

Figure 3:
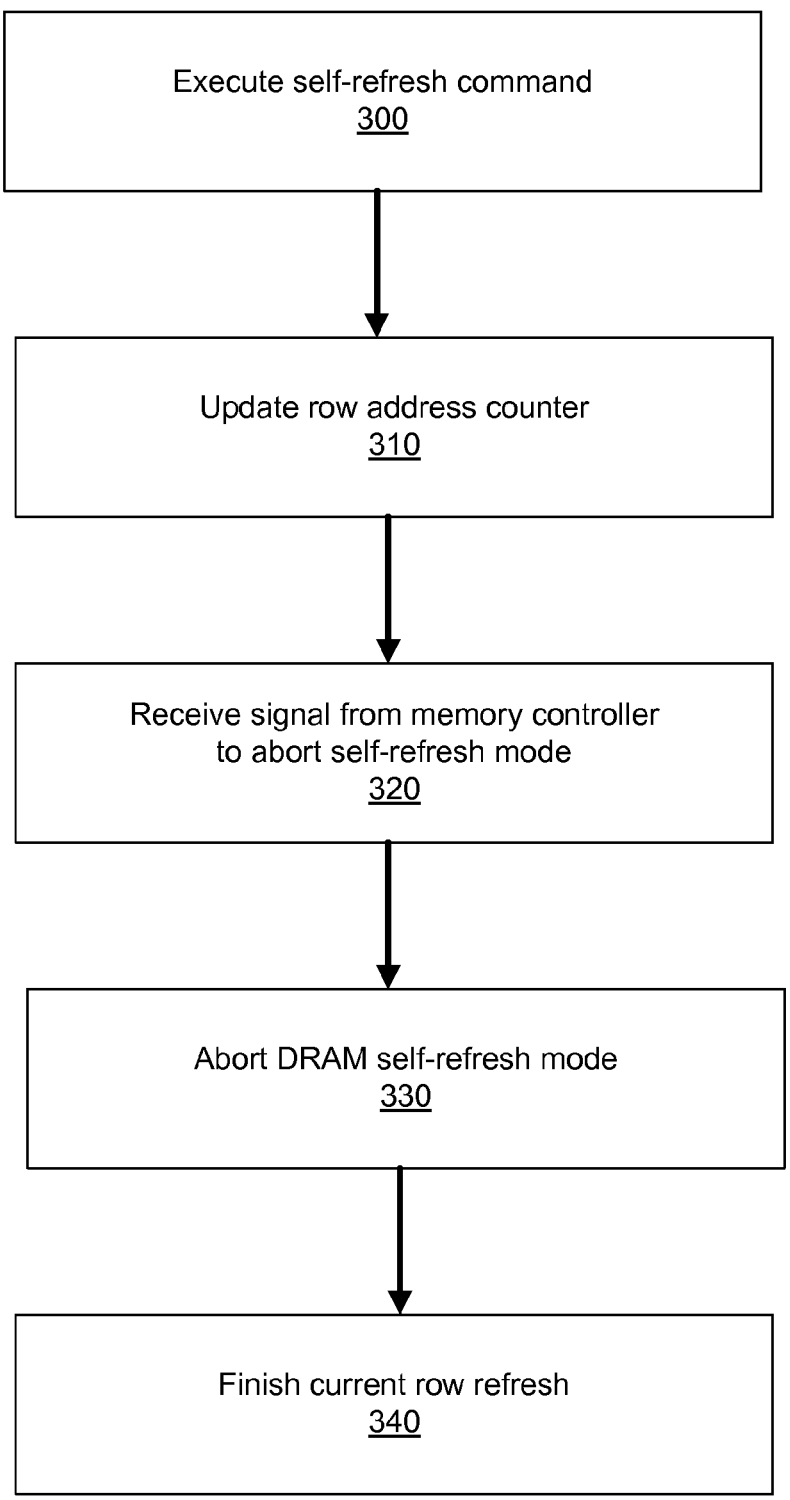
FIG. 3 is a flow diagram of an embodiment of the invention.

FIG. 3 is a flow diagram of an embodiment of the invention. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible. Operations described below may be executed via logic, circuitry or modules included in a DRAM device.

A self refresh mode is executed on a DRAM device, 300. The self refresh mode may be a plurality of commands, each command to refresh a plurality of rows of the DRAM device (e.g., 4 rows per command as described above).

The self-refresh mode may include commands to update a row address counter after each DRAM row is refreshed, 310. As describes above, the row address counter may indicate the rank, device and bank that includes the DRAM row that is to be refreshed.

An signal from a memory controller operatively coupled to the DRAM device indicating the self refresh mode is to be aborted may be received, 320. In one embodiment, this signal is a device enable signal. In other embodiments, the signal is a dedicated signal indicating the self-refresh mode is to be exited. The self-refresh mode is aborted in response to receiving the signal, 330. The DRAM device may include a self-refresh exit routine to handle self-refresh aborts consistently.

When the signal from the memory controller is received, it is possible that a self refresh was ongoing within the DRAM. If self-refresh was ongoing, then in one embodiment the self-refresh is aborted on a row boundary. In other words, the rows that are currently being refreshed are finished, but the row address counter is not incremented, 340.

For example, if DRAM was in the middle of refreshing the second of four rows, then row address counter bits [B01:B00] are at (0,1) assuming counters are incremented at end of refresh. In this embodiment, the 3rd and 4th row are not refreshed and row address counter bits [B01:B00] are reset to (0,0). Row address counters bits [B14:B2] are at the same value as before the refresh command that was aborted. In other words, they are not incremented. In other embodiments, row address counter bits [B01:B00] are incremented to reflect the last specific row that was refreshed before the self-refresh mode was aborted.

Thus, it is understood that in embodiments of the invention, due to the possibility of several aborts, the rows of a DRAM device may not be refreshed via the DRAM device self-refresh mode. The memory controller may initiate an external refresh to keep the data in the cells valid.

Figure 4:
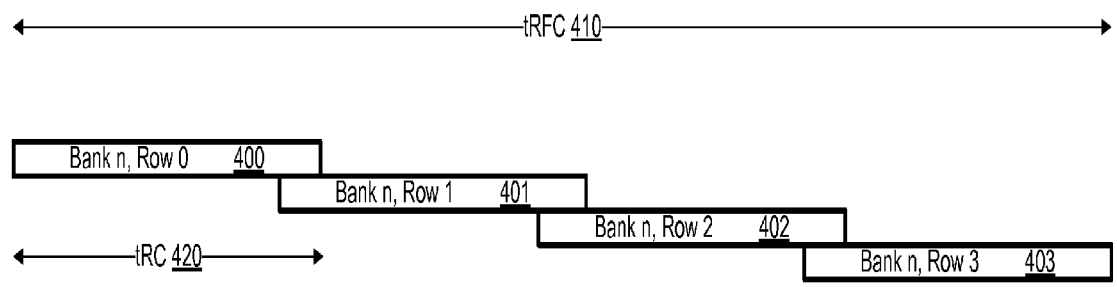
FIG. 4 illustrates a DRAM refresh cycle according to an embodiment of the invention.

FIG. 4 illustrates a DRAM refresh cycle according to an embodiment of the invention. This diagram shows a potential self-refresh cycle for four rows of a bank according to an embodiment of the invention.

In this embodiment, a refresh command will refresh rows 400-403. The time to complete this command is represented by tRFC 410, while the time to complete a refresh of each row is represented by tRC 420.

It is to be understood that the fast self-refresh exit time in embodiments of the invention is tRC 420 (plus a guard band) as opposed to tRFC 410 (plus a guard band). As illustrated in FIG. 4, tRC 420 is significantly shorter than tRFC 410. In this example, a 2 GBit DRAM devices a presumed, and thus tRC is 45 ns while tRFC is 160 ns. It is understood that the discrepancy between tRC and tRFC in high density DRAM devices is larger (e.g., tRFC for a 4 GBit device is in the range of 300 ns, while tRFC for an 8 Gbit device is in the range of 550 ns).

In one embodiment, a memory controller will at least periodically issue an extra DRAM device refresh command upon causing a DRAM device to exit the self-refresh mode. This ensures that all rows of a DRAM device are refreshed in the presence of a plurality of self-refresh mode aborts.

Various components referred to above as processes, servers, or tools described herein may be a means for performing the functions described. Each component described herein includes software or hardware, or a combination of these. The components can be implemented as software modules, hardware modules, special-purpose hardware (e.g., application specific hardware, ASICs, DSPs, etc.), embedded controllers, hardwired circuitry, etc. Software content (e.g., data, instructions, configuration) may be provided via an article of manufacture including a computer storage readable medium, which provides content that represents instructions that can be executed. The content may result in a computer performing various functions/operations described herein. A computer readable storage medium includes any mechanism that provides (i.e., stores and/or transmits) information in a form accessible by a computer (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A computer readable storage medium may also include a storage or database from which content can be downloaded. A computer readable medium may also include a device or product having content stored thereon at a time of sale or delivery. Thus, delivering a device with stored content, or offering content for download over a communication medium may be understood as providing an article of manufacture with such content described herein.

The invention claimed is:

1. A system comprising:
a dynamic random access memory (DRAM) device configured to execute a self-refresh mode, wherein in the self-refresh mode the DRAM device is configured to issue internal refresh commands to manage refresh internally, wherein an internal refresh command is to refresh a plurality of rows of the DRAM device within a refresh interval tRFC; and
a memory controller operatively coupled to the DRAM device, and configured to send a signal to cause the DRAM device to exit the self-refresh mode; and
when the DRAM device is configured to abort the self-refresh mode, in response to the signal from the memory controller, the DRAM device is configured to abort the self-refresh mode including to exit self-refresh mode prior to completion of the refresh interval tRFC, and otherwise to not abort the self-refresh mode.

2. The system of claim 1, wherein the signal from the memory controller comprises a clock enable signal.

3. The system of claim 1, wherein the DRAM device is configured to complete refresh of a DRAM row and to not refresh all rows of the plurality of rows.

4. The system of claim 3, wherein a row address counter is not incremented to indicate the completion of refresh of the DRAM row.

5. The system of claim 3, wherein a row address counter is incremented to indicate the completion of refresh of the DRAM row.

6. The system of claim 1, the memory controller to further send an enable signal to the DRAM device to enable the DRAM device to abort the self-refresh mode.

7. The system of claim 6, wherein the memory controller is configured to send an external self-refresh in response to enabling the DRAM device.

8. A dynamic random access memory (DRAM) device comprising:
a plurality of dynamic random access memory (DRAM) rows;
an input/output interface configured to operatively couple to a memory controller, the input/output interface configured to receive a self-refresh abort signal from the memory controller; and
refresh logic configured to execute a self-refresh mode, wherein in the self-refresh mode the DRAM device is configured to issue internal refresh commands to manage refresh internally, wherein the DRAM device is configured to refresh a plurality of DRAM rows within a refresh interval tRFC based on an internal refresh command, and when the DRAM device is configured to abort the self-refresh mode, in response to the self-refresh abort signal from the memory controller, the refresh logic is configured to abort the self-refresh mode including to exit self-refresh mode prior to completion of the refresh interval tRFC, and otherwise to not abort the self-refresh mode.

9. The DRAM device of claim 8, wherein the self-refresh abort signal from the memory controller comprises a clock enable signal.

10. The DRAM device of claim 8, wherein the DRAM device is configured to complete refresh of a DRAM row and to not refresh all rows of the plurality of rows.

11. The DRAM device of claim 10, wherein a row address counter is not incremented to indicate the completion of refresh of the DRAM row.

12. The DRAM device of claim 10, wherein a row address counter is incremented to indicate the completion of refresh of the DRAM row.

13. The DRAM device of claim 8, further comprising logic to receive a signal from the memory controller to enable the DRAM device to abort the self-refresh mode.

14. A method comprising:
executing a self-refresh mode on a dynamic random access memory (DRAM) device, wherein in the self-refresh mode the DRAM device issues internal refresh commands to manage refresh internally, wherein an internal refresh command refreshes a plurality of rows of the DRAM device within a refresh interval tRFC;
receiving a signal from a memory controller operatively coupled to the DRAM device; and
when the DRAM device is configured to abort the self-refresh mode, aborting the self-refresh mode in response to receiving the signal from the memory controller, including exiting self-refresh mode prior to completion of the refresh interval tRFC, and otherwise not aborting the self-refresh mode.

15. The method of claim 14, wherein the signal from the memory controller comprises a clock enable signal.

16. The method of claim 14, wherein aborting the self-refresh mode comprises finishing refresh of a DRAM row and not finishing refresh of all rows of the plurality of rows.

17. The method of claim 16, wherein a row address counter is not incremented to indicate the finished refresh of the DRAM row.

18. The method of claim 16, wherein a row address counter is incremented to indicate the finished refresh of the DRAM row.

* * * * *